(12) United States Patent
Ni et al.

(10) Patent No.: US 10,777,654 B2
(45) Date of Patent: Sep. 15, 2020

(54) METHOD FOR MANUFACTURING NITROGEN-FACE POLARITY GALLIUM NITRIDE EPITAXIAL STRUCTURE

(71) Applicant: Suzhou Han Hua Semiconductor Co.,Ltd, Suzhou (CN)

(72) Inventors: Xianfeng Ni, Suzhou (CN); Qian Fan, Suzhou (CN); Wei He, Suzhou (CN)

(73) Assignee: SUZHOU HAN HUA SEMICONDUCTOR CO., LTD., Suzhou, Jiangsu (CN)

( * ) Notice: Subject to any disclaimer, the term of this patent is extended or adjusted under 35 U.S.C. 154(b) by 0 days.

(21) Appl. No.: 16/413,636

(22) Filed: May 16, 2019

(65) Prior Publication Data
US 2019/0267470 A1   Aug. 29, 2019

(30) Foreign Application Priority Data

Sep. 21, 2018   (CN) .......................... 2018 1 1092015

(51) Int. Cl.
*H01L 21/02* (2006.01)
*H01L 29/66* (2006.01)
*H01L 29/778* (2006.01)
*H01L 29/20* (2006.01)

(52) U.S. Cl.
CPC .... *H01L 29/66462* (2013.01); *H01L 21/0254* (2013.01); *H01L 21/02389* (2013.01); *H01L 21/02634* (2013.01); *H01L 29/2003* (2013.01); *H01L 29/7781* (2013.01)

(58) Field of Classification Search
None
See application file for complete search history.

(56) References Cited

U.S. PATENT DOCUMENTS

2014/0264379 A1* 9/2014 Kub .................. H01L 29/41725
257/77

* cited by examiner

*Primary Examiner* — Jack S Chen
(74) *Attorney, Agent, or Firm* — Westerman, Hattori, Daniels & Adrian, LLP

(57) ABSTRACT

The present invention relates to a method for manufacturing a nitrogen-face polarity gallium nitride epitaxial structure, which includes: providing a gallium nitride template which includes a substrate and a first nitrogen-face polarity gallium nitride layer positioned on the substrate; re-growing the gallium nitride on a surface of the first nitrogen-face polarity gallium nitride layer to form a second nitrogen-face polarity gallium nitride layer; and sequentially growing a barrier layer and a channel layer on the second nitrogen-face polarity gallium nitride layer. The method for manufacturing the nitrogen-face polarity gallium nitride epitaxial structure provided by the present application enables a simple growth of the nitrogen-face polarity gallium nitride, can effectively eliminate the radio frequency dispersion phenomenon, and is beneficial to large-scale production and utilization of the nitrogen-face polarity gallium nitride epitaxial structure.

8 Claims, 2 Drawing Sheets

METHOD FOR MANUFACTURING NITROGEN-FACE POLARITY GALLIUM NITRIDE EPITAXIAL STRUCTURE

TECHNICAL FIELD

The present invention relates to the technical field of semiconductor manufacturing, in particular to a method for manufacturing a nitrogen-face polarity gallium nitride epitaxial structure.

BACKGROUND

As a representative of the third generation of semiconductor materials, gallium nitride (GaN) has many excellent characteristics, such as high breakdown field, high electron mobility, high two-dimensional electron gas concentration, and good thermal stability, etc. The semiconductor devices based on gallium nitride, such as high electron mobility transistor (HEMT), heterostructure field effect transistor (HFET) and the like, have been put into use, and have obvious advantages especially in areas where high power and high frequency are required, such as radio frequency and microwave, etc.

GaN materials have two polarities along a C-axis, i.e. an N-face polarity and a Ga-face polarity. GaN in most HEMT devices has the Ga-face polarity, while N-face polarity GaN is based on the opposite crystalline orientation. The advantages of N-face polarity GaN include: a) better two-dimensional electron gas (2DEG) carrier confinement mechanism under negative bias conditions, which can form better off-state pinch off through back barrier; b) since the metal electrode is directly disposed on the conductive channel layer (such as GaN or InGaN material), an ohmic contact with a lower resistivity can be obtained, and the ohmic contact on GaN material has a lower Schottky barrier than the ohmic contact formed on AlGaN material in conventional HEMT devices. However, how to grow GaN with N-face polarity has always been a difficulty, and there is still no suitable process to produce HEMT devices with N-face polarity GaN.

SUMMARY

The present application provides a method for manufacturing a nitrogen-face polarity gallium nitride epitaxial structure, which includes:

providing a gallium nitride template which includes a substrate and a first nitrogen-face polarity gallium nitride layer positioned on the substrate;

re-growing gallium nitride on a surface of the first nitrogen-face polarity gallium nitride layer to form a second nitrogen-face polarity gallium nitride layer; and sequentially growing a barrier layer and a channel layer on the second nitrogen-face polarity gallium nitride layer.

In one embodiment, the first nitrogen-face polarity gallium nitride layer has a thickness of 1 μm to 5 μm.

In one embodiment, the second nitrogen-face polarity gallium nitride layer has a thickness of 10 nm to 5 μm.

In one embodiment, the channel layer has a thickness of 10 nm to 100 nm.

In one embodiment, the barrier layer has a thickness of 10 nm to 100 nm.

In one embodiment, the gallium nitride template is washed and blow dried before forming the second nitrogen-face polarity gallium nitride layer.

In one embodiment, a source, a drain, and a gate are respectively formed on the channel layer.

The method for manufacturing the nitrogen-face polarity gallium nitride epitaxial structure provided by the present application enables a simple growth of the nitrogen-face polarity gallium nitride, can effectively eliminate the radio frequency dispersion phenomenon, and is beneficial for large-scale production and utilization of the nitrogen-face polarity gallium nitride epitaxial structure.

DETAILED DESCRIPTION OF THE EMBODIMENTS

A method for manufacturing the nitrogen-face polarity gallium nitride epitaxial structure provided by the present invention will be described in further detail below with reference to the drawings and specific embodiments. Advantages and features of the present invention will become more apparent from the following description and claims. It should be noted that the drawings that are all in a very simplified form and not drawn to precise scale are only for purposes of conveniently and clearly illustrating the embodiments of the present invention.

Referring to FIGS. 1-4, a method for manufacturing a nitrogen-face polarity gallium nitride epitaxial structure proposed in this embodiment includes the following steps.

S10: a nitride-face polarity gallium nitride template which includes a substrate and a first nitride-face polarity gallium nitride layer positioned on the substrate is provided.

Figure 1:
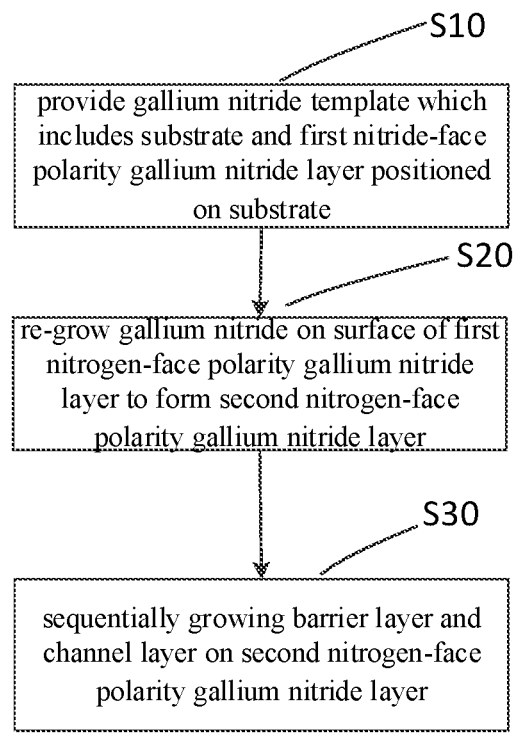
FIG. 1 is a flow chart of a method for manufacturing a nitrogen-face polarity gallium nitride epitaxial structure according to one embodiment.
Figure 2:
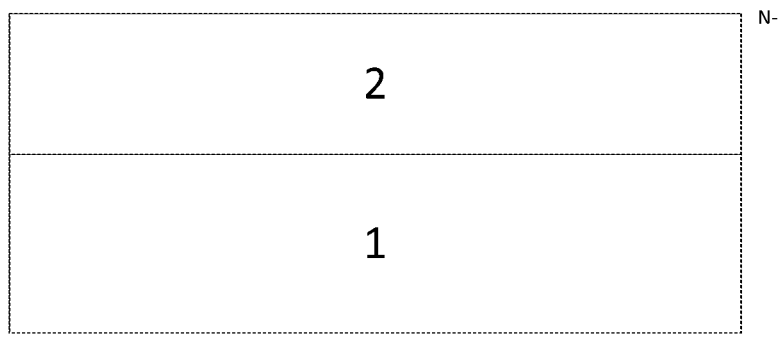
FIGS. 2-4 are schematic diagrams showing the manufacture of the nitrogen-face polarity gallium nitride epitaxial structure according to one embodiment.

Specifically, as shown in FIG. 2, the nitrogen-face polarity gallium nitride template includes substrate 1 and first nitrogen-face polarity gallium nitride layer 2 positioned on the substrate. Substrate 1 has a thickness greater than 10 μm, and the thickness of first nitrogen-face polarity gallium nitride layer 2 is in the range from 1 μm to 5 μm. A surface of first nitrogen-face polarity gallium nitride layer 2 in contact with substrate 1 has a gallium polarity, and an opposite surface of first nitrogen-face polarity gallium nitride layer 2 has a nitrogen polarity. Substrate 1 may be a carbon-face polarity silicon carbide substrate, a sapphire substrate, or a silicon substrate. First nitrogen-face polarity gallium nitride layer 2 may also be cut out of a gallium nitride single crystal, i.e., a nitrogen-face polarity gallium nitride single crystal substrate. The gallium nitride template has a high resistance and a smooth surface morphology with impurities and point defects as few as possible and the threading dislocation density as low as possible.

S20: gallium nitride is regrown on top of the first nitrogen-face polarity gallium nitride layer to form a second nitrogen-face polarity gallium nitride layer.

Figure 3:
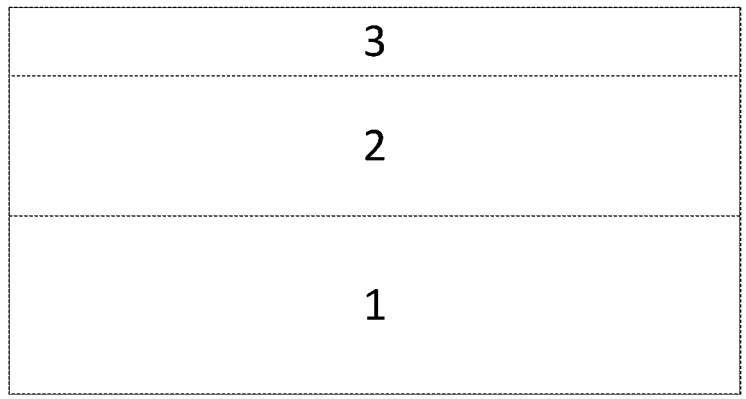

Specifically, the gallium nitride template can be cleaned with chemicals such as acetone or methanol, and then dried with $N_2$. Second nitrogen-face polarity gallium nitride layer 3 is grown on the cleaned gallium nitride template to form a structure as shown in FIG. 3. Second gallium nitride layer 3 may be formed by a process such as metal organic chemical vapor deposition, molecular beam epitaxy, direct current sputtering, or the like. For example, the gallium nitride template is placed in a vacuum chamber and heated to 100-1200° C. (the temperature depends on the chosen process) in a gaseous environment (nitrogen, hydrogen, or a mixture of nitrogen and hydrogen), and a gallium nitride film will grow on the first gallium nitride layer to form second gallium nitride layer 3 with a thickness of 10 nm to 5 μm. Since first gallium nitride layer 2 has the nitrogen-face polarity, second gallium nitride layer 3 will inherit the polarity of the first gallium nitride layer, and therefore there is no need to additionally control the polarity during the growth of the gallium nitride film. An interface between first gallium nitride layer 2 and second gallium nitride layer 3 is called a regrowth interface.

S30: a barrier layer and a channel layer are sequentially grown on the second nitrogen-face polarity gallium nitride layer.

Figure 4:
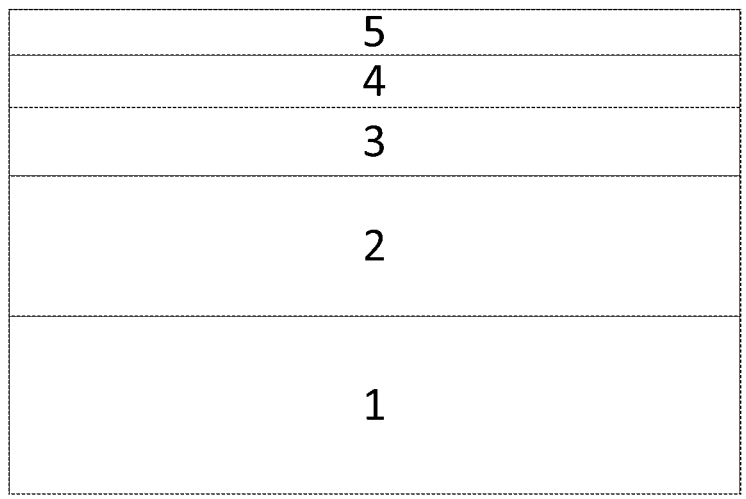

Specifically, barrier layer 4 can be grown on second gallium nitride layer 3 by a process such as metal organic chemical vapor deposition, molecular beam epitaxy, or direct current sputtering etc. Then, channel layer 5 can be grown on barrier layer 4 to form a structure as shown in FIG. 4. Due to a band gap difference between barrier layer 4 and channel layer 5 and polarization charges at an interface between barrier layer 4 and channel layer 5, a two-dimensional electron gas, which is a conductive channel, will be formed at the interface where channel layer 5 contacts barrier layer 4. Channel layer 5 may be a gallium nitride layer (a third gallium nitride layer), and the process of growing the third gallium nitride layer may be the same as that of second gallium nitride layer 3. Since second gallium nitride layer 3 has the nitrogen-face polarity, the third gallium nitride layer will inherit the polarity of second gallium nitride layer 3, and therefore, there is no need to additionally control the polarity during the growth of the gallium nitride film. The thickness of channel layer 5 is 10 nm to 100 nm. In another embodiment, the material of channel layer 5 may also be InGaN. The material of barrier layer 4 may be AlGaN or InAlN, and the specific process for forming barrier layer 4 depends on the material of barrier layer 4 and corresponding composition parts. The thickness of barrier layer 4 is 10 nm to 100 nm.

After channel layer 5 is formed, a source, a drain, and a gate may be formed on channel layer 5, respectively. The source and the drain are respectively positioned at two sides of the gate. The gate may be a metal stack of nickel, gold, platinum, etc., and the source and the drain may be an alloy of any of metals such as titanium, aluminum, nickel, gold, etc.

In addition, in order to reduce gate leakage and better control two-dimensional electron gas carriers, a cap layer may be grown on channel layer 5. The cap layer may be made of an AlGaN or AlN material.

A major problem of the common nitrogen-face polarity gallium nitride epitaxial structure is the radio frequency dispersion, i.e. the output power density and power-added and the efficiency reduced in radio frequency operation mode as compared to that of the DC mode. When a pulse voltage is applied to the gate, the source-drain current response differs greatly from that in the DC case. The radio frequency dispersion phenomenon is generally attributed to the positively charged donor-like trap state that slowly responds at the interface between second gallium nitride layer 3 and barrier layer 4, and the radio frequency dispersion phenomenon can be eliminated by eliminating the donor-like trap state. In this embodiment, a certain amount of n-type unintentional doping impurities will inevitably exist at the regrowth interface between first gallium nitride layer 2 and second gallium nitride layer 3. The impurities are generally silicon ions or oxygen ions, which usually come from the regrowth process of the gallium nitride (such as the process during which first gallium nitride layer 2 is exposed or washed in the air). The n-type impurities will diffuse to the interface between second gallium nitride layer 3 and barrier layer 4, thereby eliminating the donor-like trap state and the radio frequency dispersion phenomenon.

To sum up, the method for manufacturing the nitrogen-face polarity gallium nitride epitaxial structure provided by the present application enables a simple growth of the nitrogen-face polarity gallium nitride, can effectively eliminate the radio frequency dispersion phenomenon, and is beneficial to large-scale production and utilization of the nitrogen-face polarity gallium nitride epitaxial structure.

The technical features of the above-mentioned embodiments can be combined in many other ways. In order to simplify the description, not all possible combinations of the technical features of the above-mentioned embodiments will be described here. However, as long as there is no contradiction in the combination of these technical features, it should be considered as being in the scope described in the present invention.

The above-mentioned embodiments only represent several embodiments of the present invention, and their descriptions are specific and detailed, but they should not be regarded as limiting the scope of the present invention. It should be pointed out that for those of ordinary skill in the art, other modifications and improvements may be made with the concept of the present invention, which are all within the protection scope of the present invention. Therefore, the protection scope of the present invention shall be subject to the appended claims.

What is claimed is:

1. A method for manufacturing a nitrogen-face polarity gallium nitride epitaxial structure, comprising:
   providing a gallium nitride template, wherein the gallium nitride template comprises a substrate and a first nitrogen-face polarity gallium nitride layer positioned on the substrate;
   loading the gallium nitride template in air to a vacuum chamber and re-growing gallium nitride on a surface of the first nitrogen-face polarity gallium nitride layer to form a second nitrogen-face polarity gallium nitride layer; and
   sequentially growing a barrier layer and a channel layer on the second nitrogen-face polarity gallium nitride layer to form a two-dimensional electron gas, wherein sequentially growing the barrier layer and the channel layer diffuses n-type unintentional doping impurities from an interface between the first nitrogen-face polarity gallium nitride layer and the second nitrogen-face polarity gallium nitride layer to an interface between the second nitrogen-face polarity gallium nitride layer and the barrier layer.

2. The method for manufacturing the nitrogen-face polarity gallium nitride epitaxial structure according to claim 1, wherein the first nitrogen-face polarity gallium nitride layer has a thickness of 1 μm to 5 μm.

3. The method for manufacturing the nitrogen-face polarity gallium nitride epitaxial structure according to claim 1, wherein the second nitrogen-face polarity gallium nitride layer has a thickness of 10 nm to 5 μm.

4. The method for manufacturing the nitrogen-face polarity gallium nitride epitaxial structure according to claim 1, wherein the channel layer has a thickness of 10 nm to 100 nm.

5. The method for manufacturing the nitrogen-face polarity gallium nitride epitaxial structure according to claim 1, wherein the barrier layer has a thickness of 10 nm to 100 nm.

6. The method for manufacturing the nitrogen-face polarity gallium nitride epitaxial structure according to claim 1, further comprising washing and blow drying the gallium nitride template, before loading the gallium nitride template in air to the vacuum chamber.

7. The method for manufacturing the nitrogen-face polarity gallium nitride epitaxial structure according to claim 1, wherein the n-type unintentional doping impurities comprise silicon ions.

8. The method for manufacturing the nitrogen-face polarity gallium nitride epitaxial structure according to claim 1, wherein the n-type unintentional doping impurities comprise oxygen ions.

* * * * *